(12) United States Patent
Shimada

(10) Patent No.: US 6,743,034 B2
(45) Date of Patent: Jun. 1, 2004

(54) SOCKET FOR ELECTRICAL PARTS

(75) Inventor: Hideo Shimada, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/316,099

(22) Filed: Dec. 11, 2002

(65) Prior Publication Data

US 2003/0109163 A1 Jun. 12, 2003

(30) Foreign Application Priority Data

Dec. 12, 2001 (JP) ........................................ 2001-379235

(51) Int. Cl.⁷ .............................................. H01R 11/22
(52) U.S. Cl. ...................................... 439/268; 439/259
(58) Field of Search ................................ 439/268, 264, 439/263, 261; 324/755, 754, 758, 763

(56) References Cited

U.S. PATENT DOCUMENTS

RE36,217 E * 6/1999 Petersen ..................... 324/755
6,027,355 A * 2/2000 Ikeya ......................... 439/268

* cited by examiner

*Primary Examiner*—Alex Gilman
(74) *Attorney, Agent, or Firm*—Staas & Halsey LLP

(57) ABSTRACT

A socket for an electrical part has a socket body, in which a number of contact pins are arranged adjacently each other so as to contact terminals of an electrical part. A movable member is disposed so as to elastically deforming the contact pins, and an operation member is also disposed to be vertically movable to thereby move the movable member. In such socket, each of the contact pins is provided with a pair of elastic pieces contacting the terminal of the electrical part, at least one of the elastic pieces is elastically deformed by the movement of the movable member so as to be contacted to or separated from the terminal of the electrical part, and when at least one of the elastic pieces is elastically deformed and separated from the terminal of the electrical part, the elastic pieces of the adjacent contact pins pass each other without contacting.

13 Claims, 15 Drawing Sheets

PRIOR ART

SOCKET FOR ELECTRICAL PARTS

BACKGROUND OF THE INVENTION

1. Field of the Invention

The present invention relates to a socket for electrical parts for detachably accommodating and holding an electrical part such as a semiconductor device (called "IC package" hereinlater), and more particularly, relates to a socket for electrical parts capable of solving defect or inconvenience caused at a time of narrowing a pitch of terminals of the electrical part.

2. Related Art of the Invention

In prior art, there is known, as such "socket for an electrical part", an IC socket to which an IC package, as "electrical part", is mounted to thereby establish an electrical connection between the IC package and a printed circuit board of, for example, a tester.

In such IC package, a number of solder balls as terminals are arranged to the lower surface of the IC package so as to extend or project downward in a using state of the IC socket so as to provide a lattice arrangement having vertical and horizontal rows.

On the other hand, the IC socket is provided with a socket body to which the IC package is mounted and accommodated and a number of contact pins are arranged so as to be contacted to terminals (i.e., solder balls) of the IC package. The socket body is also provided with a movable member, to be vertically movable, for elastically deforming the contact pins and thereby contacting or separating the contact pins to or from the terminals of the IC package. The socket body is further provided with an operation member for vertically moving the movable member through a lever member.

These contact pins are arranged adjacently and each of them has a pair of elastic pieces which contact both side portions of the solder ball of the IC package. These elastic pieces are elastically movable and opened in their interval according to the vertical motion of the movable member to thereby clamp or separate the solder ball.

In the prior art structure mentioned above, however, the elastic pieces of the contact pin is elastically deformed sideways, so that when it is required for the pitch of the solder ball to be made small, the arrangement pitch of the contact pins is also made small. This will adversely result in that the elastic piece easily contacts another elastic piece of an adjacent contact pin, thus providing a fear of occurrence of short circuit. It is therefore difficult to make small the pitch of the solder ball arrangement.

SUMMARY OF THE INVENTION

The present invention was conceived to solve the defect or disadvantage encountered in the prior art mentioned above and to provide a socket for an electrical part capable of solving inconvenience caused at a time of narrowing a pitch of terminals of the electrical part.

The above and other objects of the present invention can be achieved according to the present invention by providing a socket for an electrical part having a socket body in which a number of contact pins are arranged adjacently each other so as to contact terminals of an electrical part, a movable member is disposed so as to elastically deforming the contact pins, and an operation member is disposed to be vertically movable to thereby move the movable member, wherein each of the contact pins is provided with a pair of elastic pieces contacting the terminal of the electrical part, at least one of the elastic pieces is elastically deformed by the movement of the movable member so as to be contacted to or separated from the terminal of the electrical part, and when at least one of the elastic pieces is elastically deformed and separated from the terminal of the electrical part, the elastic piece of one of the contact pins and another elastic piece of an adjacent contact pin pass each other without contacting.

In a preferred embodiment, it is possible that the movable member is vertically moved in accordance with the vertical motion of the operation member so as to elastically deform both of the paired elastic pieces of the contact pin. The movable member may be horizontally slid in accordance with the vertical motion of the operation member so as to elastically deform both of the paired elastic pieces of the contact pin. Furthermore, the terminal of the electrical part is a solder ball having substantially spherical shape disposed to a surface of the IC package, and the paired elastic pieces of the contact pin are provided with contact portions, respectively, which are disposed on both side portions of the solder ball so as to interpose, therebetween, a center line of the solder ball along a displacement direction of the elastic pieces. In addition, a separation member is disposed to the socket body at a portion between one elastic piece of a contact pin and another elastic piece of the adjacent contact pin, and in such structure, the first mentioned elastic piece is elastically deformed and separated from the terminal of the electrical part, while passing each other.

In a modified aspect, there is provided a socket for an electrical part comprising:

a socket body;

a number of contact pins which contact terminals of an electricalpart for electrical connection;

a movable member disposed to the socket body for elastically deforming the contact pins;

an operation member disposed to the socket body to be vertically movable thereto for moving the movable member, each of the contact pins comprising a pair of elastic pieces and contact portions formed to end portions of the elastic pieces, respectively, at least one of the elastic pieces being elastically deformed by the movement of the movable member so as to be contacted to or separated from the terminal of the electrical part, and when at least one of the elastic pieces is elastically deformed and separated from the terminal of the electrical part, the elastic pieces of the adjacent contact pins pass each other without contacting.

According to the present invention of the characters and structures mentioned above, when the elastic piece of one contact pin is elastically deformed and separated from the terminal of the electrical part, this elastic piece and one elastic piece of the adjacent contact pin pass each other without contacting, so that any defect such as short-circuit of the contact portions of the adjacent contact pins can be avoided. In addition, the pitch between the adjacent contact pins can be made small in comparison with the conventional structure and it is therefore possible to satisfy a requirement of making narrow the pitch. In addition, it is also possible to construct the contact portions of the contact pins so as to have the same displacement direction (open/close direction) with respect to the arrangement direction of the contact pins. Further, a mold for molding the socket body to which the contact pins are fitted can be easily manufactured.

Furthermore, when the contact portions of the elastic pieces of the contact pin are disposed on both the side surface portions of the solder ball and contact the side surfaces thereof, a wiping effect can be advantageously achieved.

Still furthermore, the location of the separation member between the elastic pieces of the adjacent contact pins can ensure the prevention of the contact portions of the contact pins from being contacted.

The nature and further characteristic features of the present invention will be made more clear from the following descriptions made with reference to the accompanying drawings.

DESCRIPTION OF THE PREFERRED EMBODIMENTS

Figure 1:
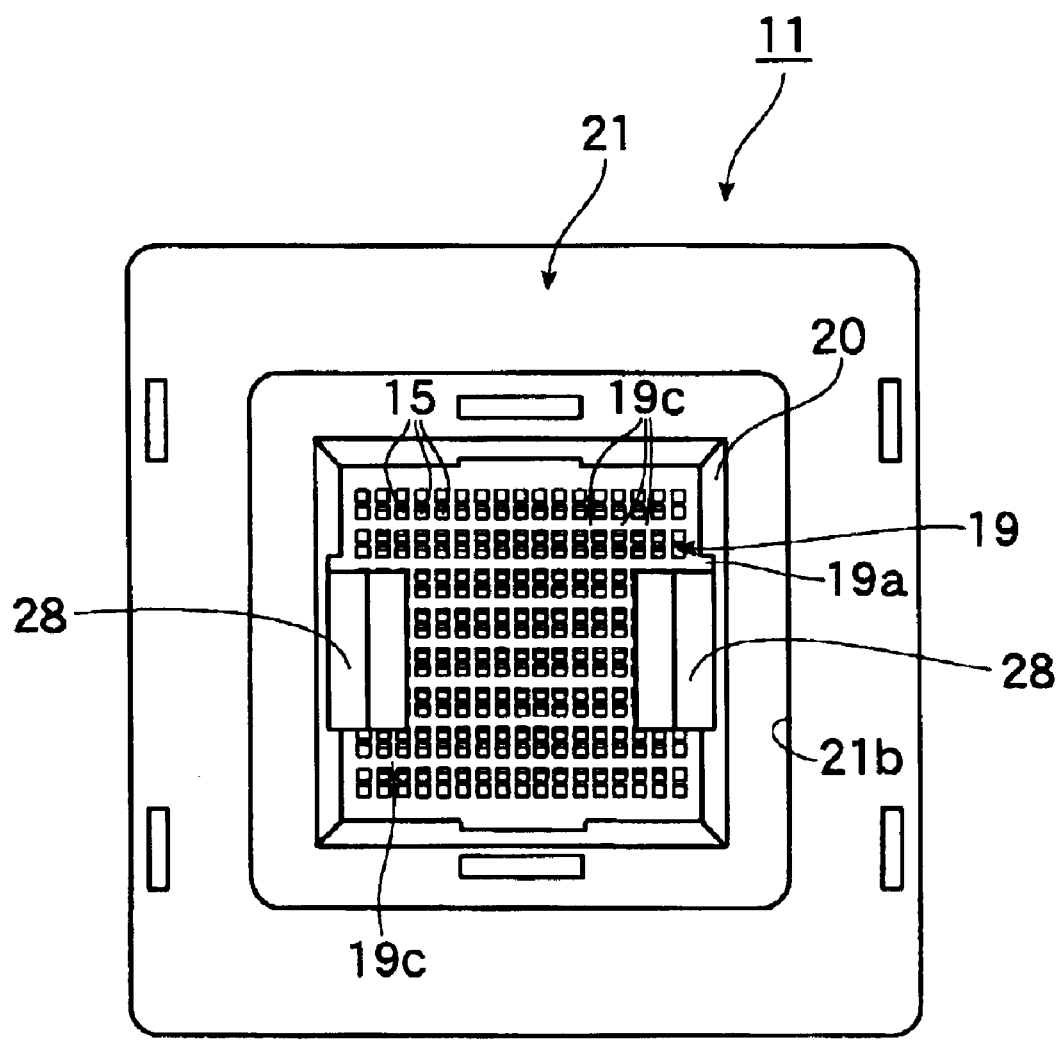
FIG. 1 is a plan view of an IC socket according to a first embodiment of the present invention.

Preferred embodiments of the present invention will be described hereunder with reference to the accompanying drawings.

[First Embodiment]

FIGS. 1 to 12B represent the first embodiment of the present invention.

With reference to these figures, reference numeral 11 denotes an IC socket as "socket for electrical part", and the IC socket 11 has a purpose of carrying out a performance test of an IC package 12 as "electrical part", and this purpose is achieved by electrical connection between a solder ball 12b as "terminal" of the IC package 12 and a printed circuit board, not shown, of a measuring instrument such as tester.

Further, it is first to be noted that terms "upper", "lower", "right", "left" or like are used herein with reference to illustrated state or in a generally using state of the socket.

Figure 8B:
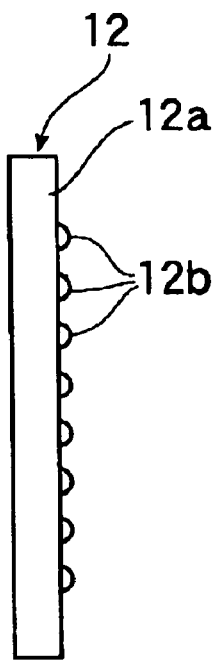
FIG. 8A is a bottom view of an IC package concerning the first embodiment of the present invention and FIG. 8B is a left side view of FIG. 8A.
Figure 8A:
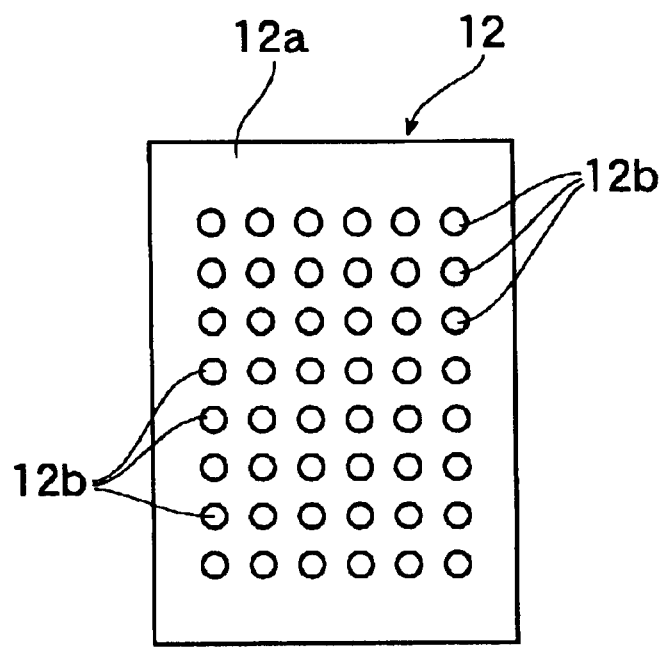

The IC package 12 is of so-called a FBGA (Fine Pitch Ball Grid Array) type, as shown in FIGS. 8A and 8B, which has a rectangular IC package body 12a and a number of approximately spherical solder balls 12b extending downward from a lower surface of the IC package body 12a in matrix arrangement having vertical and horizontal rows.

Figure 2:
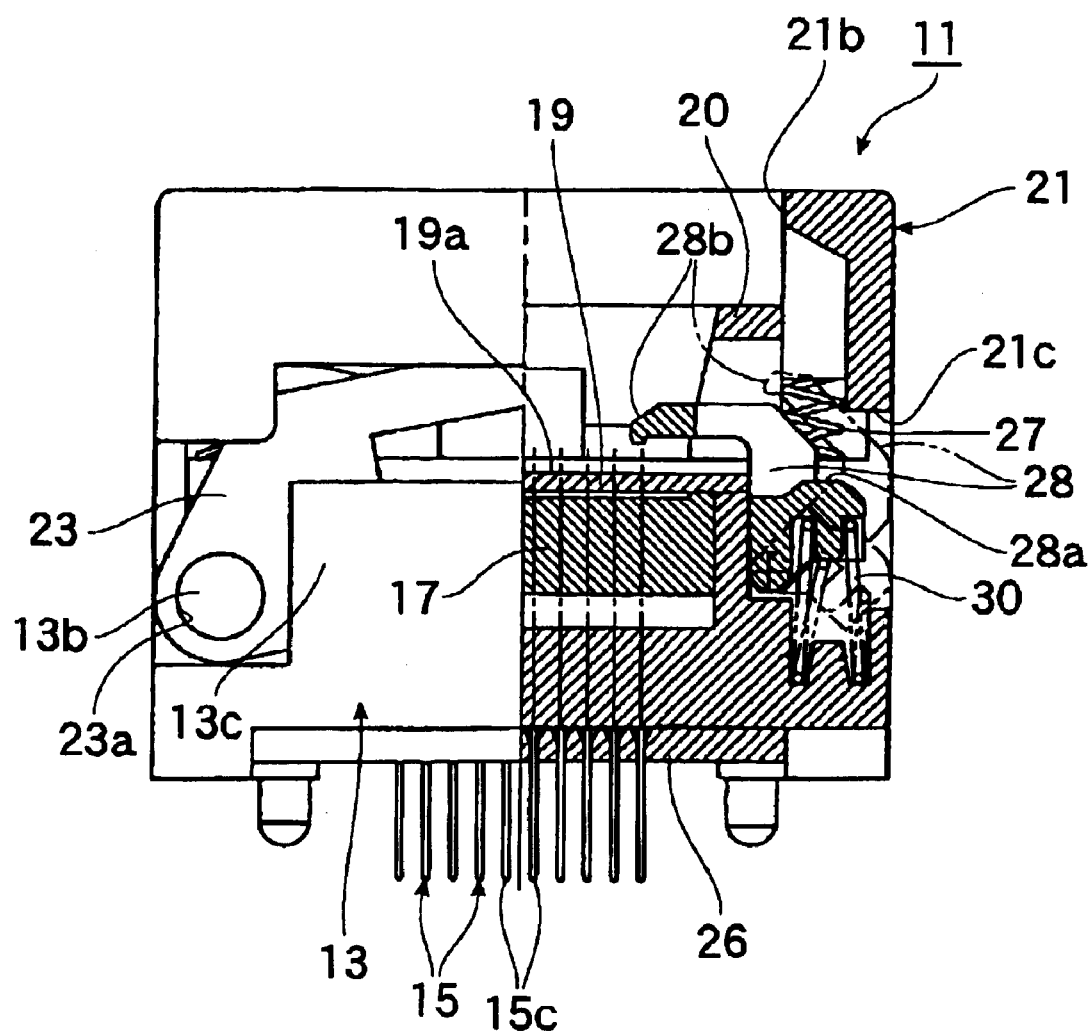
FIG. 2 is a front view, half in section, of the IC socket of the first embodiment of FIG. 1.
Figure 3:
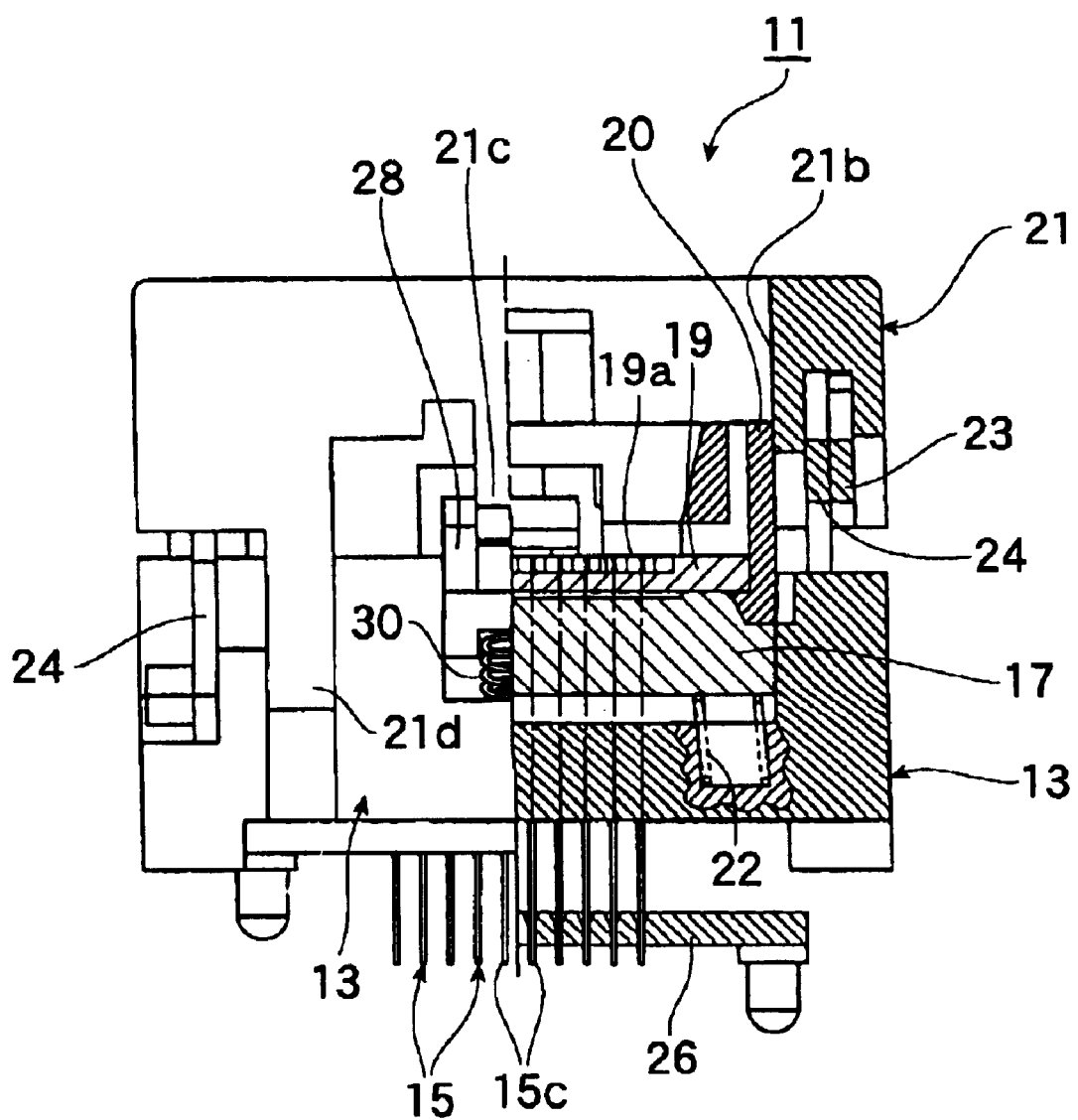
FIG. 3 is a side view, half in section, of the IC socket of the first embodiment of FIG. 1.
Figure 4:
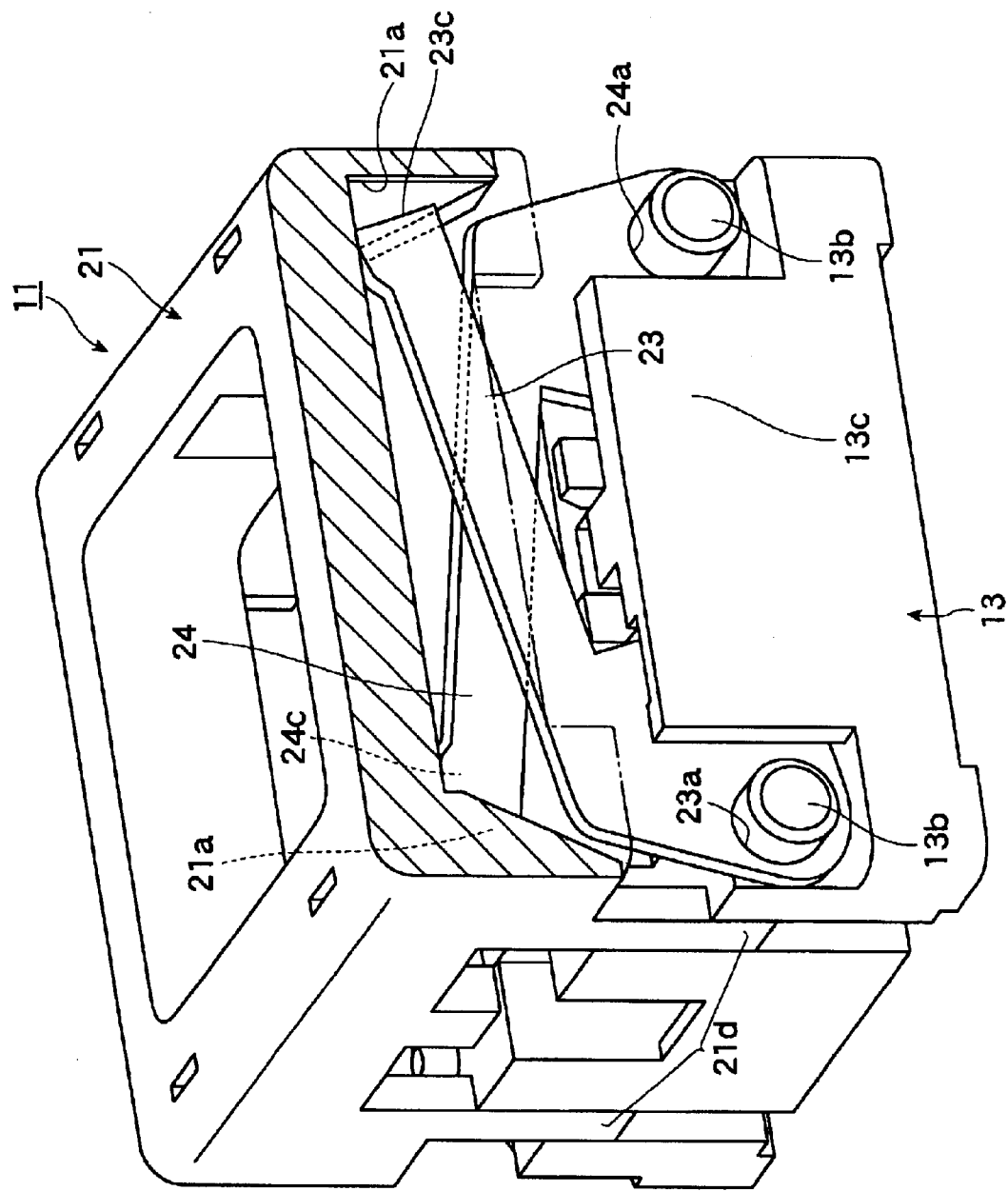
FIG. 4 is a perspective view, partially in section, of the IC socket of the first embodiment of FIG. 1.

On the other hand, the IC socket 11 has a socket body 13 made of synthetic resin and mounted on a printed circuit board such as shown in FIGS. 2 and 3, and the socket body 13 is provided with a number of contact pins 15 which contact to or separate from the solder balls 12b of the IC package 12, respectively. A movable member 17 is also provided for the socket body 13 to be vertically movable with respect to the socket body 13 to thereby displace or deform the contact pins 15. A top plate 19 is further provided for the socket body 13 at a position above the movable member 17. The top plate 19 is provided with a guide member 20 for guiding and positioning the IC package 12 to a predetermined position at the time of mounting the IC package 12 to the socket body 13. An operation member 21 for vertically moving the movable member 17 is further provided for the socket body 13 to be vertically movable with respect thereto.

Figure 9:
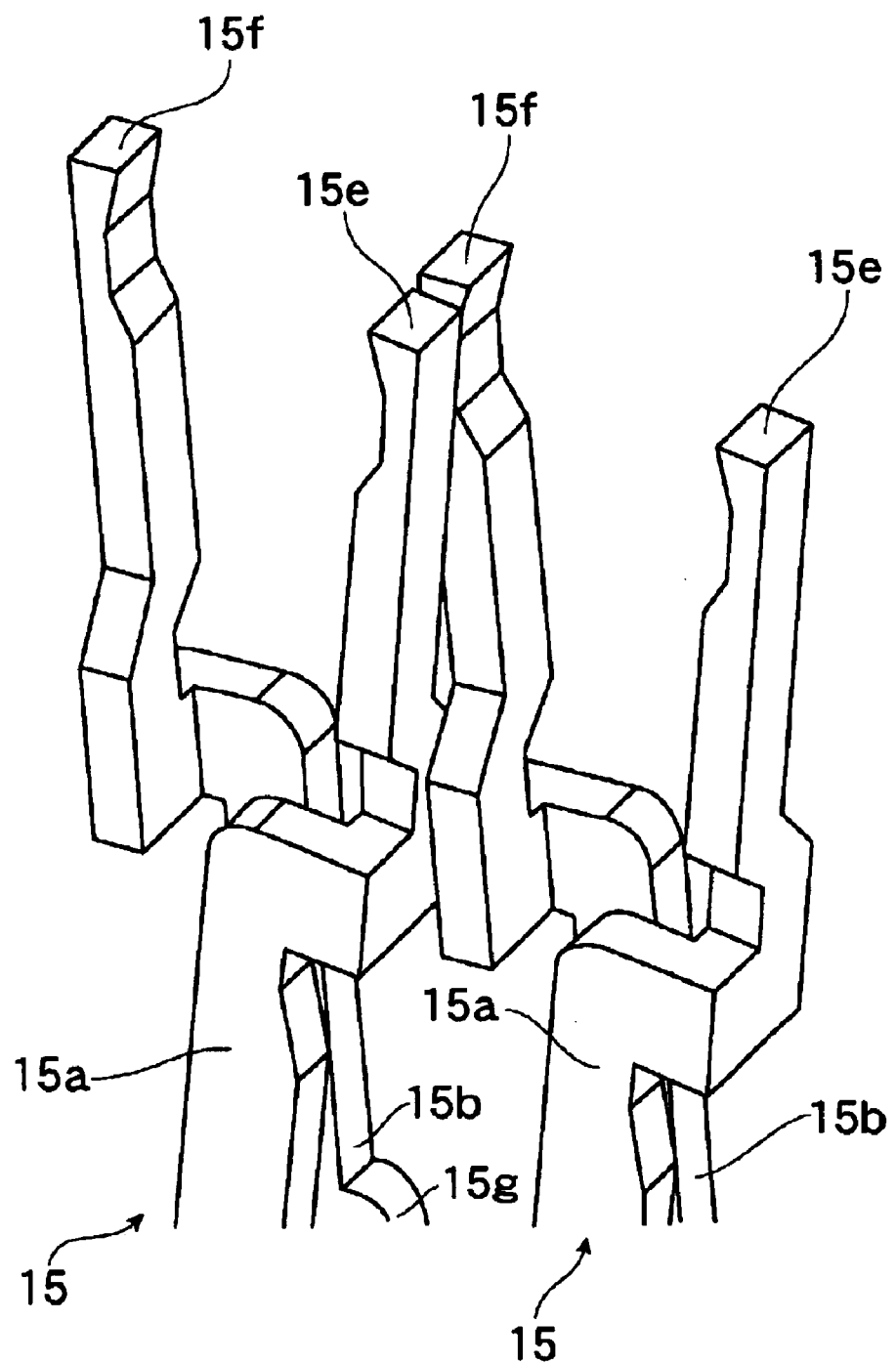
FIG. 9 is a perspective view of a portion of a contact pin arrangement, in an enlarged scale, according to the first embodiment.
Figure 10:
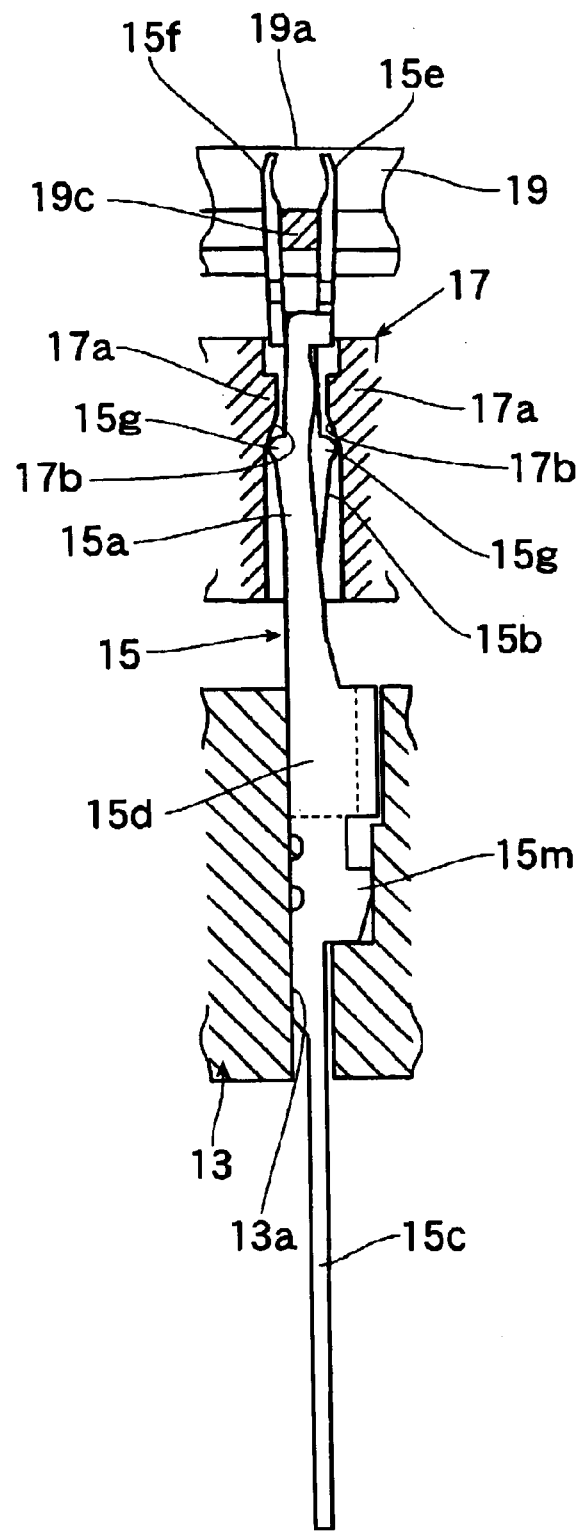
FIG. 10 is a sectional view showing a closed state of contact portions of the contact pin of FIG. 9.

The contact pins 15 are formed from a plate member, through a press-working, having springy property and good electrical conductivity so as to provide a shape such as shown in FIGS. 9 and 10.

Figure 11B:
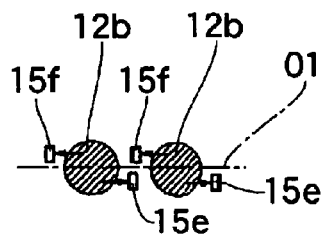
FIG. 11A is a sectional view showing a state that both the contact portions of the contact pin of FIG. 9 are opened and FIG. 11B is a plan view thereof.

More in detail, the contact pin 15 is composed of an upper pair of elastic pieces 15a and 15b and a lower single solder tail portion 15c, and the elastic pieces 15a and 15b are connected at their lower end portions through a base portion 15d having a U-shape as shown in FIG. 11D so that the paired elastic pieces 15a and 15b are opposed to each other. Furthermore, contact portions 15e and 15f are formed to the upper (i.e., front), as viewed, end portions of the elastic pieces 15a and 15b so as to clamp the solder ball 12b between these contact portions 15e and 15f to thereby establish an electric connection therebetween. The elastic pieces 15a and 15b is formed with bent portions 15g substantially projecting outward. When these bent portions 15g are pressed by a cam portion 17a, mentioned hereinlater, of the movable member 17, the contact portions 15e and 15f are opened (refer to FIGS. 11A and 11B, for example).

Furthermore, as shown in FIG. 9, both the elastic pieces 15a and 15b are bent towards each other at their upper portions so that when both the elastic pieces 15a and 15b are elastically deformed and separated from the solder ball 12b of the IC package 12, the contact portions 15e and 15f formed to these elastic pieces 15a and 15b pass each other without contacting the contact portions 15e and 15f of the elastic pieces 15a and 15b of the adjacent contact pin 15 as shown in FIG. 11B.

Furthermore, the contact portions 15e, 15f of the paired elastic pieces 15a, 15b of the contact pin 15 are positioned on both the side surface portions of the solder ball 12b so that the center line O1 extending along the displacement direction of the elastic pieces 15a, 15b lies therebetween as shown in FIGS. 11A, 11B and FIGS. 12A, 12B.

The solder tail portion 15c and the base portion 15d of each of the contact pins 15 of the structure mentioned above are inserted, as shown in FIGS. 10 to 12B, into a fit-in hole 13a formed to the socket body 13, and a coming-off prevention portion 15m formed to the base portion 15d bites the socket body 13 so as to prevent the contact pin 15 from coming off upward. The solder tail portion 15c extending downward from the socket body 13 further projects downward through a location board 26, as shown in FIGS. 2 and 3, and is then inserted into a through hole formed to the printed circuit board, not shown, and soldered, thus completing the connection.

A number of such contact pins 15 are arranged to the socket body 13, as shown in FIG. 1 so as to accord with the arrangement of the solder balls 12b of the IC package 12.

Figure 5:
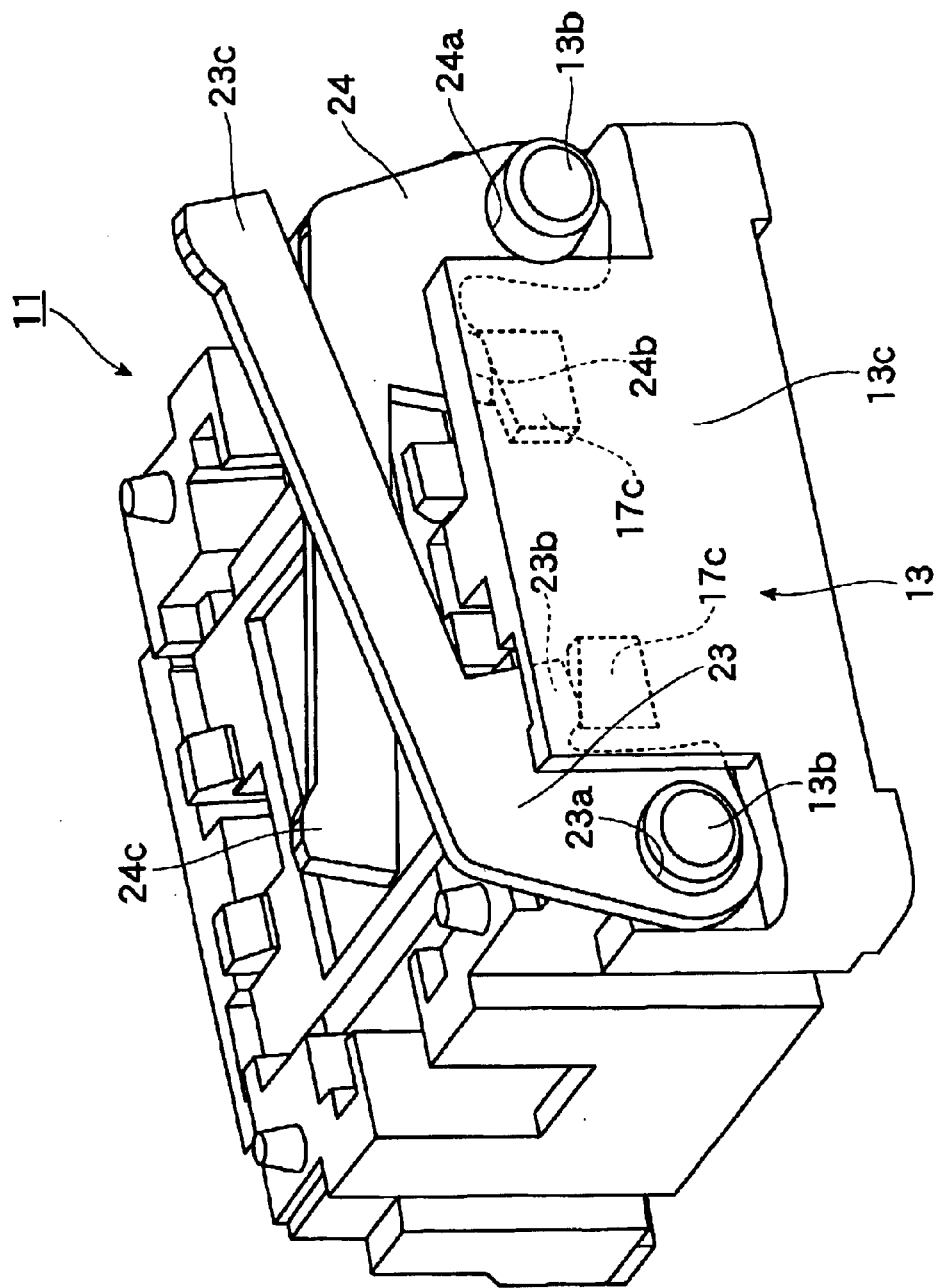
FIG. 5 is a perspective view of the IC socket of the first embodiment of FIG. 1, from which an operation member is removed.

On the other hand, the movable member 17 is formed from synthetic resin material, and as shown in FIG. 2, is mounted to the socket body 13 to be vertically movable, that is, movable in a direction perpendicular to a mount surface 19a of a top plate 19, which will be mentioned hereinlater, and urged upward by means of spring 22. The movable member 17 is moved in the vertical direction by first and second lever 23 and 24, as one set which is attached to each of paired sides of the socket body 13 as shown in FIG. 5. That is, two sets of levers 23 and 24 are mounted to the side portions of the socket body 13, respectively. Further, in FIG. 5, another one set is eliminated from the illustration.

These first and second levers 23 and 24 are formed from a metal plate and formed, at their base end portions, with fitting holes 23a and 24a, into which shaft (shank) portions 13b are fitted in projecting manner, the shaft portions 13b being integrally formed to the socket body 13, made of synthetic resin, to be rotatable. Each set of levers 23 and 24 provides an X-shape in arrangement as shown in FIG. 5.

Furthermore, the first and second levers 23 and 24 are respectively provided, at their base end side portions, with pressing (pushing or depressing) portions 23b and 24b, which abut against the upper surfaces of flat-shaped pressed portions (portions to be pressed (pushed or depressed)) 17c of the movable member 17 and depress them downward. Further, the socket body 13 is provided with side wall portions 13c each guiding the side portions of the base end sides of the levers 23 and 24 to prevent both levers 23 and 24 from coming off from the shaft portions 13b thereof.

Furthermore, these levers 23 and 24 have front (free) end portions 23c and 24c, which are fitted into guide grooves 21a formed to the rear sides of the operation member 21 so as to prevent the levers 23 and 24 from falling sideways.

Figure 6:
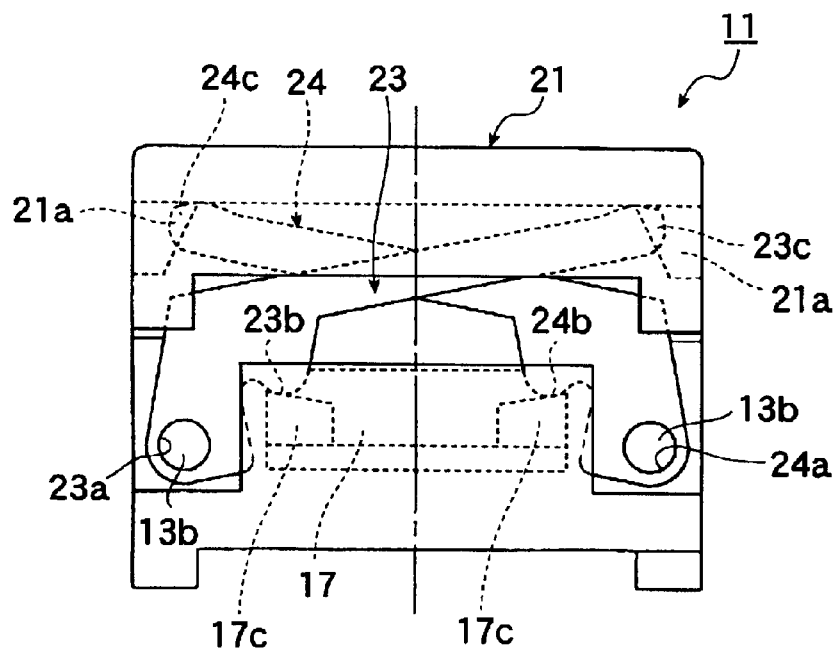
FIG. 6 is a front view showing a state that the operation member of the IC socket according to the first embodiment is moved to its uppermost position.
Figure 7:
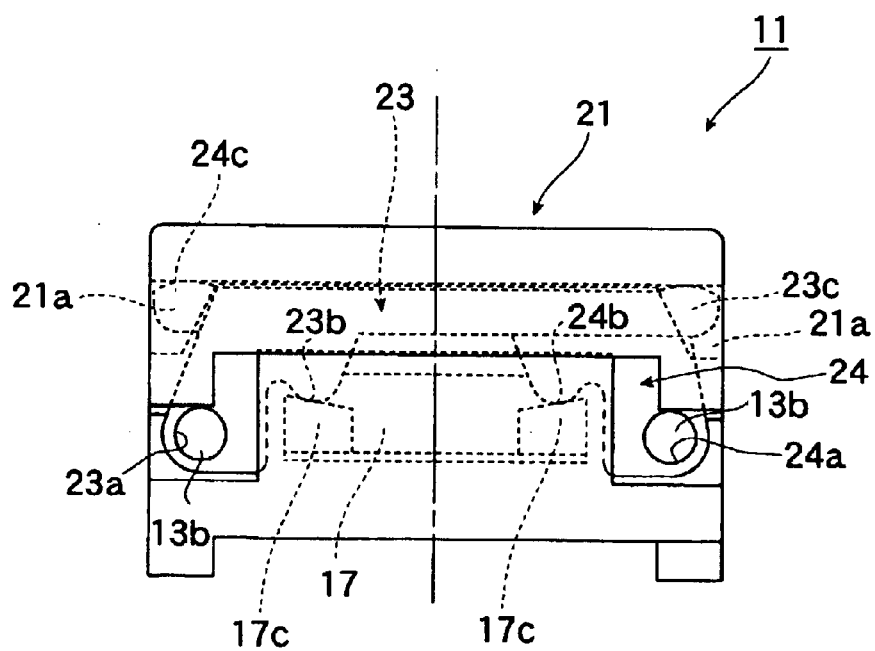
FIG. 7 is a front view showing a state that the operation member of the IC socket according to the first embodiment is moved to its lowermost position.

According to the structure mentioned above, when the operation member 21 is lowered, in a state shown in FIGS. 6 and 7, for example, the levers 23 and 24 are rotated (pressed) downward and, hence, the pressing portions 23b and 24b of the levers 23 and 24 press downward the portions 17c of the movable member 17, thus lowering the movable member 17.

Then, with reference to FIGS. 10 to 12B, the movable member 17 is formed with cam portions 17a so as to be each arranged between adjacent contact pins 15. The cam portion 17a has sliding surfaces 17b formed on both sides thereof so as to contact and press the projections 15g of the elastic pieces 15a and 15b of the contact pins 15 adjacent to this cam portion 17a. That is, one cam portion 17a presses both the projections 15g of the elastic pieces 15a and 15b of the adjacent two contact pins 15, and when both the projections 15g of the paired elastic pieces 15a and 15b are pressed by the paired cam portions 17a disposed on both sides of this contact pin 15 in the direction approaching each other, both the contact portions 15e and 15f of each of the contact pin 15 is moved to be opened from each other.

On the other hand, as shown in FIGS. 1 and 3, the top plate 19 is provided with an accommodation (mount) surface portion 19a on which the IC package 12 is accommodated, and as shown in FIG. 10, this top plate 19 is provided with positioning ribs 19c, each of which is inserted between the paired contact portions 15e and 15f of each contact pin 15. In a state that no external force is applied to the elastic pieces 15a and 15b of the contact pin 15 (i.e., a state that the paired contact portions 15e and 15f are closed), the positioning rib 19c is in a state of being clamped between the elastic pieces 15a and 15b.

Still furthermore, as shown in FIG. 1, the operation member 21 has an opening 21b of a rectangular frame-shape of a size capable of receiving the IC package 12, and through this opening 21b, the IC package 12 is inserted and rested on the predetermined position of the accommodation surface portion 19a of the top plate 19. This operation member 21 is disposed, as shown in FIG. 2, for example, to be vertically movable with respect to the socket body 13 and is urged upward by means of spring 27. Then, at the uppermost position of the rising motion of the operation member 21, an engaging claw 21d is engaged with an engagement portion of the socket body 13 to thereby prevent the operation member 21 from coming off.

In addition, as shown in FIGS. 2 and 3, the operation member 21 is provided with an operating portion 21c for rotating a latch 28.

This latch 28 is mounted to the socket body 13 to be rotatable about a shaft or pin, though not shown in detail, and as shown in FIG. 2, is urged in a closing direction by means of spring 30. The latch 28 has a front end portion to which a pressing piece 28b to thereby press the peripheral edge portion of the IC package 12.

The latch 28 is formed with a pressed portion 28a on which the operating portion 21c of the operation member 21 slides, and when the operation member 21 is lowered, the operating portion 21c slides on the pressed portion 28a. The latch 28 is rotated in a clockwise direction as shown with two-dot chain line in FIG. 2, and the press portion 28b is retired from the arrangement position of the IC package 12.

The IC socket 11 of the structure mentioned above will be used in the following manner.

At a time when it is required to set the IC package 12 to the IC socket 11, the operation member 21 is depressed downward. Then, the front end portions 23a and 24a of the respective levers 23 and 24 are also depressed downward by the operation member 21 and is rotated (pivoted) downward about the shafts 13b from the state shown in FIG. 6 to the state shown in FIG. 7. According to this rotating motion, the press portions 17c of the movable member 17 are pressed by the pressing portions 23b and 24b of the levers 23 and 24 and the movable member 17 is then lowered against the urging force of the spring 22.

Figure 11A:
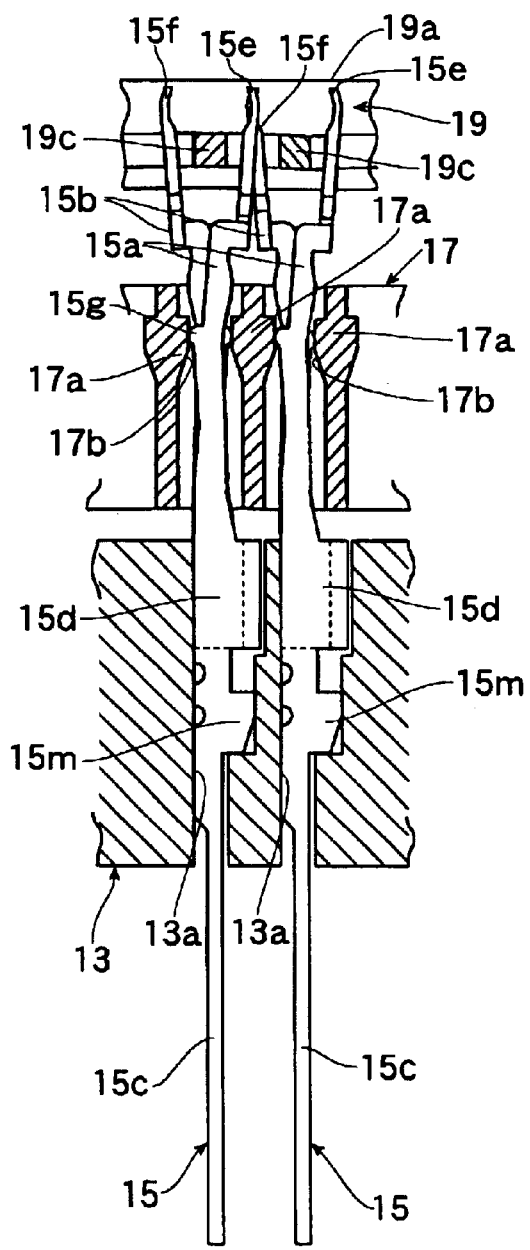

Furthermore, as described, when the movable member 17 is lowered, the cam portions 17a are also lowered from the state shown in FIG. 10 to the state shown in FIGS. 11A and 11B and both the projections 15g of the contact pin 15 are pressed by the sliding surface 17b of the cam portion 17a and the paired contact portions 15e and 15f of the contact pin 15 are opened as shown in FIGS. 11A and 11B.

At this time, as shown in FIGS. 9, 11A and 11B, in the maximally opened state of the contact portions 15e and 15f, the contact portions 15e and 15f of the adjacent contact pins 15 pass each other without contacting, so that the adjacent contact pins 15 never be contacted to each other without causing any electrical short-circuiting, and even in a case where the adjacent contact pins 15 approaches most nearly each other.

Accordingly, in comparison with prior art structure, the contact pins 15 can be arranged with narrow pitch therebetween to thereby accord with the currency of narrowing the pitch of the solder balls 12b of the IC package 12.

Figure 18:
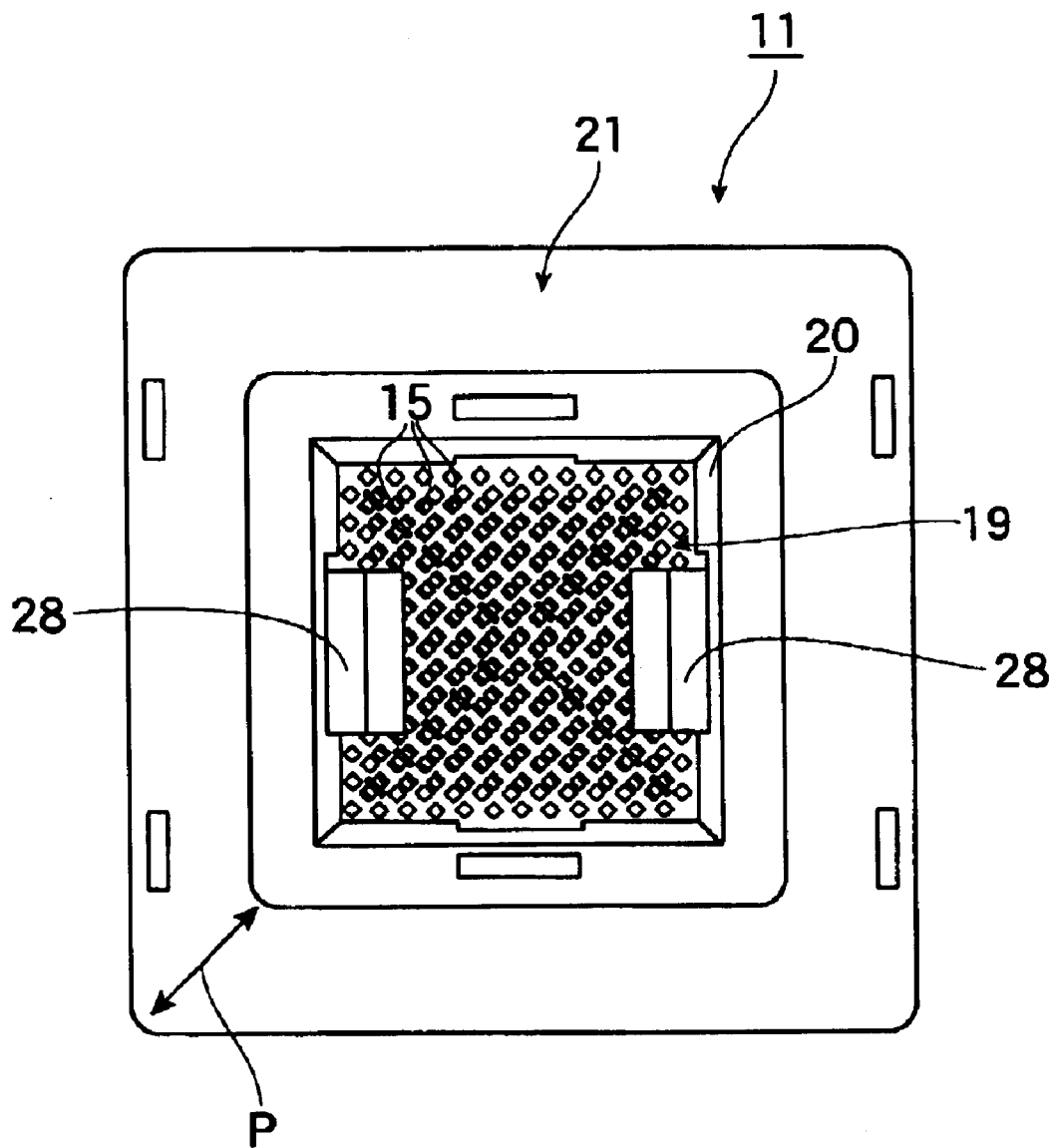
FIG. 18 is a plan view showing one example of open/close direction of an IC socket of a conventional structure.

Furthermore, in order to solve the object of narrowing the pitch of the solder balls, there may be considered an alternation as shown in FIG. 18, in which the displaced (deformed) direction, i.e., open/close direction, of the paired contact portions 15e and 15f are inclined with respect to the arranged direction of the contact pins 15 or an alternation as shown in FIG. 18, in which the contact portions 15e and 15f are opened or closed along the direction of P. For such alternations, however, it is difficult to produce a mold for molding the movable member 17, the top plate 19 and the socket body 13 through which the contact pins 15 are inserted.

On the contrary, according to the present invention, as shown in FIG. 1, it becomes possible to easily produce a mold for molding the movable member 17, the top plate 19 and the socket body 13 through which the contact pins 15 are inserted as well as to achieve the object of narrowing the pitch of the solder balls by making the deformed direction (open/close direction) of the paired contact portions 15e and 15f equal to the arrangement direction of the contact pins 15.

Moreover, at the same time, the press portion 28a of the latch 28 is pressed by the operating portion 21c of the operation member 21 and is then rotated from the position shown with the solid line in FIG. 2 to the position shown with the two-dot chain line against the urging force of the spring, and the pressing portion 28b is displaced to the retired position.

Under the state mentioned above, when the IC package 12 is released from an automatic machine and guided to the predetermined position by the tapered portion 20b of the guide member 20, the IC package 12 is then positioned and placed to the predetermined position.

According to the motions mentioned above, each of the respective solder balls 12b of IC package 12 is inserted into the space between each pair of the opened contact portions 15e and 15f of the contact pin 15 in non-contact manner. Thereafter, when the downward pressing force of the operation member 21 is released, the operation member 21 is moved upward by the urging force of the spring 27, thus also moving upward the movable member 17 by means of the spring 22, and the latch 28 is rotated in its closing direction by the urging force of the spring 30.

Figure 12B:
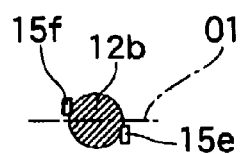
FIG. 12B is a plan view thereof.
Figure 12A:
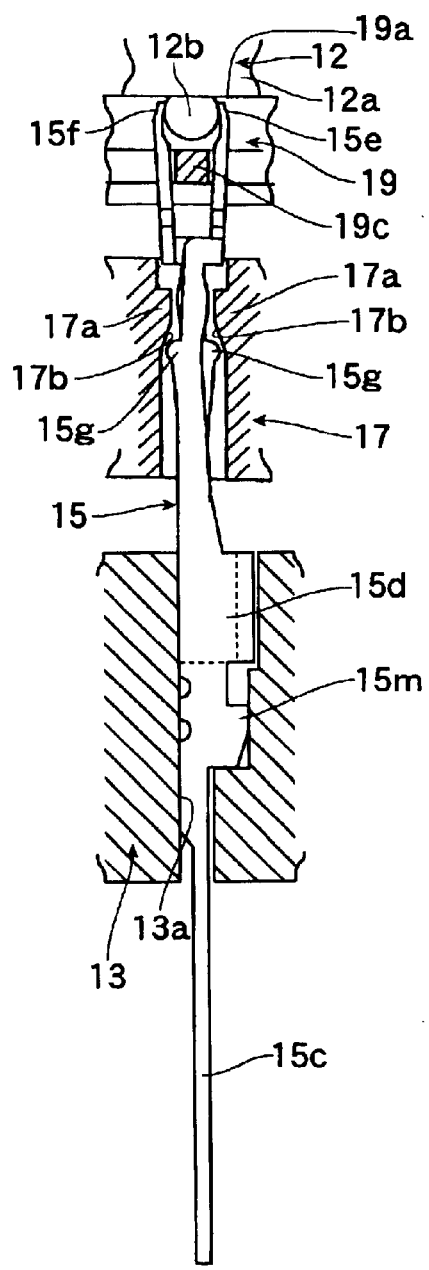
FIG. 12A is a sectional view showing a state that a solder ball is clamped between both the contact portions of the contact pin of FIG. 9

When the movable member 17 is moved upward, the pressing force of the cam portion 17a to the projection 15g of the contact pin 15 is released, and the paired contact portions 15e and 15f are moved in the closed direction (i.e., narrowed in their distance) to thereby clamp the solder ball 12b between the contact portions 15e and 15f as shown in FIGS. 12A and 12B. In this operation, since both the contact portions 15e and 15f are not positioned on the center line O1, the wiping effect can be achieved at the time when the contact portions 15e and 15f contact the side surface of the solder ball 12b.

According to such motion, the solder balls 12b of the IC package 12 is electrically connected to the printed circuit board through the contact pins 15.

Contrary to the above motions, when the IC package 12 is removed from the mounted state, in the like manner mentioned above, the operation member 21 is lowered to separate the paired contact portions 15e and 15f from the solder ball 12b, and the IC package 12 is then pulled out.

[Second Embodiment]

Figure 13:
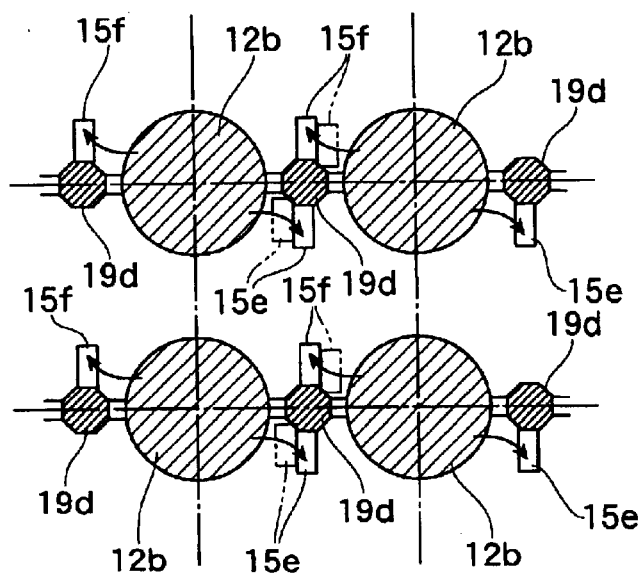
FIG. 13 is a plan view of a second embodiment according to the present invention.

FIG. 13 represents the second embodiment of the present invention.

With reference to FIG. 13, in this second embodiment, the top plate 19 is provided with a separation or isolation member 19d. When the paired contact portions 15e and 15f of the contact pin 15 are opened, the contact portions 15e and 15f slide the separation member 19d from a position shown with a two-dot chain line in FIG. 13 to a position shown with a solid line. Under the completely opened state thereof, the separation member 19d exists between the contact portion 15e of one contact pin 15 and the contact portion 15f of the adjacent contact pin 15.

According to the location of such separation member 19d, the contact portion 15e of one contact pin 15 and the contact portion 15f of the adjacent contact pin 15 can be surely prevented from contacting to each other.

The structures and functions of this second embodiment other than those mentioned above are substantially the same as those of the first embodiment, so that the details thereof are omitted herein.

[Third Embodiment]

FIGS. 14 to 17B represent the third embodiment of the present invention.

In the first and second embodiments mentioned above, the movable member 17 is moved in the vertical direction, whereas, in this third embodiment, a movable member 37 is laterally moved (i.e., moved in a horizontal direction).

Figure 14:
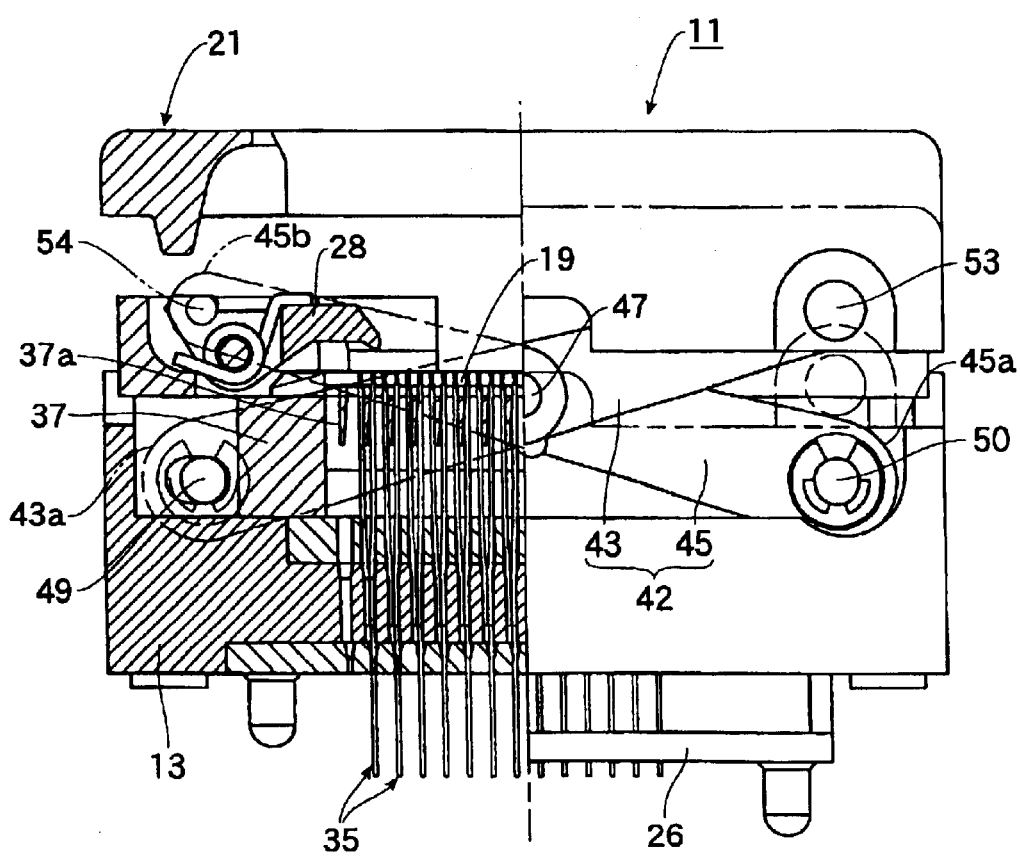
FIG. 14 is a front view, half in section, of a third embodiment of the present invention.
Figure 15:
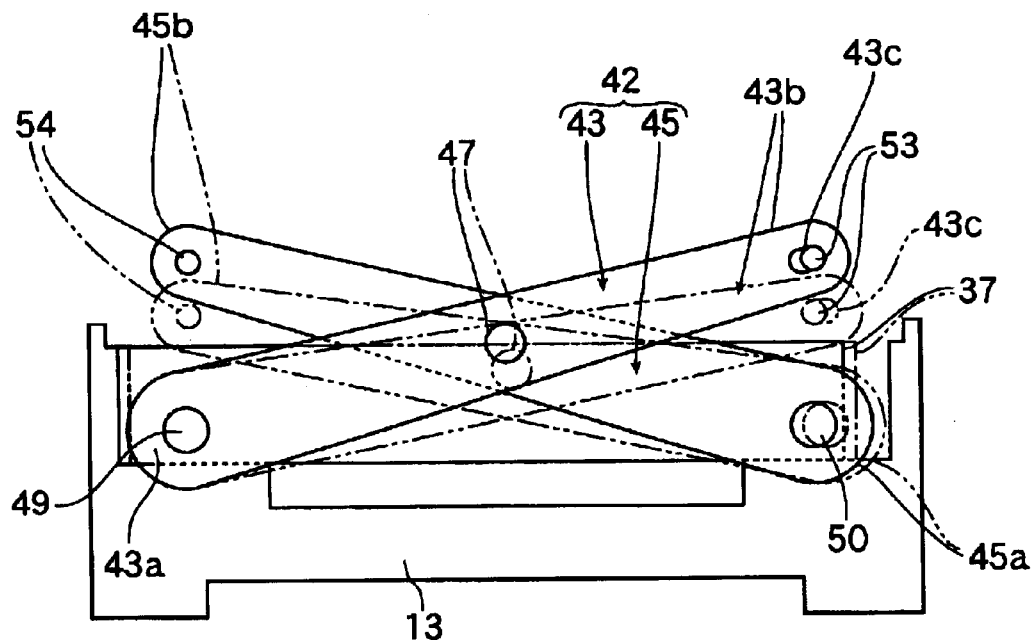
FIG. 15 is a schematic view showing an X-shaped link according to the third embodiment of FIG. 14.

That is, the movable member 37 is arranged in the socket body 13 to be laterally slidable as viewed in FIG. 14 or 15, and when the movable member 37 is slid, a movable side elastic piece 35a of a contact pin 35 arranged to the socket body 13 is elastically deformed and displaced.

The movable member 37 is slid, through an X-shaped link 42 shown in FIG. 14 or 15, by vertically moving the operation member 21, and the movable member 37 is provided with a pressing portion 37a for pressing the movable side elastic piece 35a so as to elastically deform the same.

Two such X-shaped links 42 are arranged, in an opposed manner, to side surface portions of the movable member 37 along the sliding direction. More specifically, as shown in FIGS. 14 and 15, each of the X-shaped links 42 has a first link member 43 and a second link member 45, which have the same length and are coupled together to be rotatable by means of a central coupling pin 47.

The first link member 43 has a lower end portion 43a, which is coupled to the socket body 13 to be rotatable by means of a lower end coupling pin 49, and on the other hand, the second link member 45 has a lower end portion 45a, which is coupled to one end portion of the side surface, along the sliding direction, of the movable member 37 by means of a lower end coupling pin 50. On the other hand, these first and second link members 43 and 45 have upper end portions 43b and 45b, which are coupled to be rotatable to the operation member 21 by means of upper end coupling pins 53 and 54, respectively. The upper end portion 43b of the first link member 43 is formed with a slot 43c, through which the first link member 43 is coupled to the operation member 21 by the upper coupling pin 53.

Figure 16:
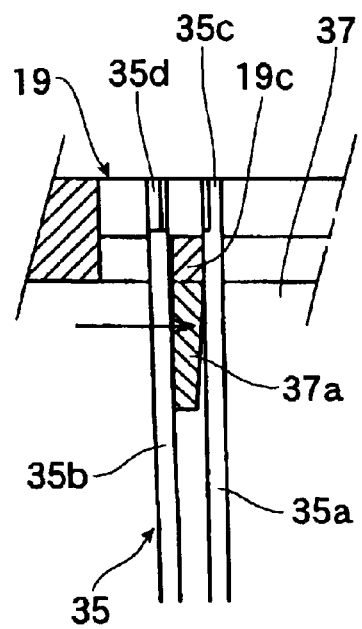
FIG. 16 is a sectional view showing a state that both the contact portions of the contact pin according to the third embodiment are closed.
Figure 17B:
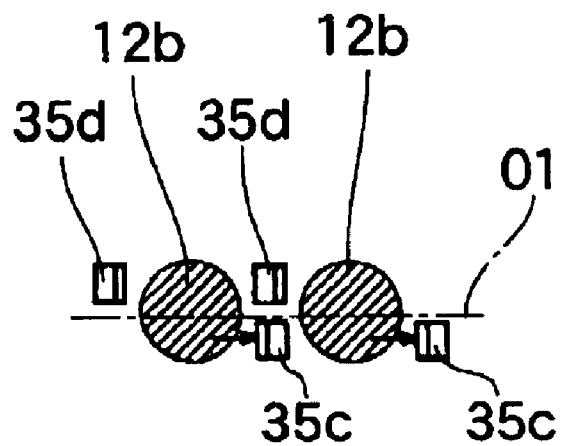
FIG. 17A is a sectional view showing a state that both the contact portions of the contact pin according to the third embodiment are opened and FIG. 17B is a plan view thereof.
Figure 17A:
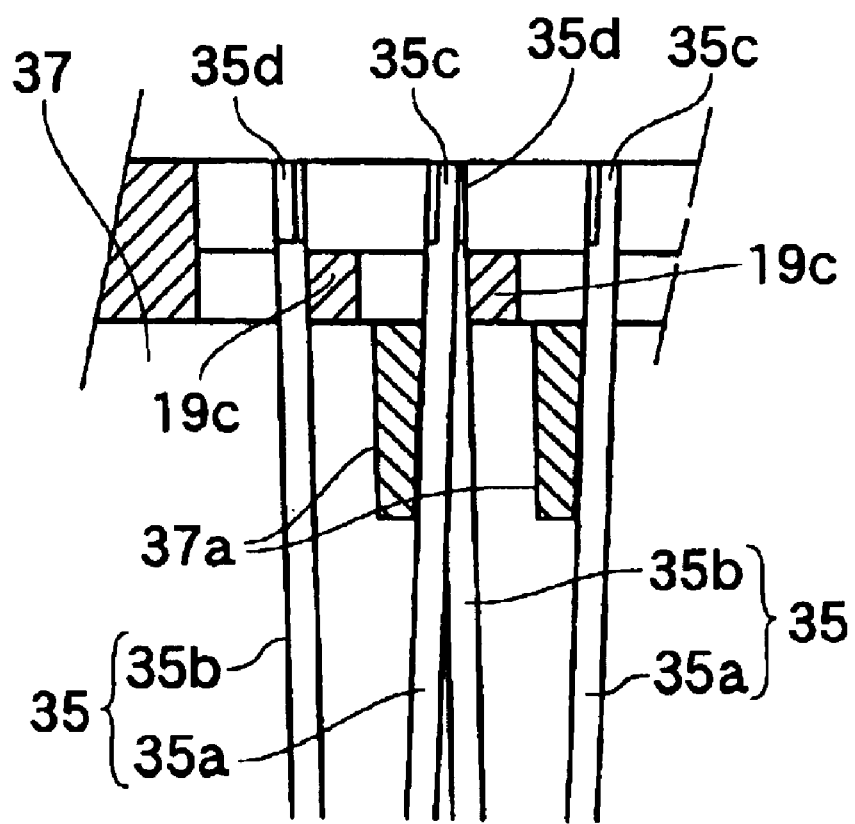

The contact pin 35 is provided with a movable side elastic piece 35a and a stationary (fixed) side elastic piece 35b, as shown in FIG. 16 and FIGS. 17A and 17B, and the movable side elastic piece 35a is pressed by a pressing portion 37a of the movable member 37 and then elastically deformed.

A movable side contact portion 35c and a stationary side contact portion 35d are formed to upper ends of the elastic pieces 35a and 35b, respectively, and these contact portions 35c and 35d are formed, as shown in FIG. 17B, such that when the movable side elastic piece 35a is elastically deformed and then separated from the solder ball 12b of the IC package, the contact portion 35c of this movable side elastic piece 35a of the contact pin 35 and the contact portion 35d of the stationary side elastic piece 35b of the adjacent contact pin 35 pass each other with out contacting.

Furthermore, the contact portions 35c and 35d of the paired elastic pieces 35a and 35b of the contact pin 35 are disposed to side surface portions of the solder ball 12b so as to interpose the center line 01 along the displacement direction of the movable elastic piece 35a.

In such embodiment, when the operation member 21 is lowered, the X-shaped links 42 are displaced as shown with two-dot chain line in FIG. 15, and through such displacement of the X-shaped links 42, the movable member 37 is slid laterally as shown with two-dot chain line in FIG. 15. Then, as shown in FIGS. 17A and 17B, the movable side elastic piece 35a of the contact pin 35 is pressed and then elastically deformed by the pressing portion 37a of the movable member 37, thus displacing the movable contact portion 35c in the opening direction.

In such case, as mentioned herein with reference to the first embodiment, the movable side contact portion 35c and the stationary side contact portion 35d of the adjacent contact pins 35 pass each other, so that both the contact portions do not contact each other and, hence, are not short-circuited, whereby the arrangement of the contact pins 35 with narrow pitch can be realized, and in addition, a mold can be easily manufactured.

It is to be noted that the present invention is not limited to the described embodiment and many other changes and modifications may be made without departing from the scopes of the appended claims.

For example, although in the described embodiments, the present invention is applied to an IC socket 11 as "socket for electrical parts", the present invention is applicable to other apparatus or device. It is of course possible to apply the present invention to the IC socket for a PGA (Pin Grid Array) type IC package without being limited to the IC socket of the BGA type IC package.

What is claimed is:

1. A socket for an electrical part having a socket body in which a number of contact pins are arranged adjacently to each other so as to contact terminals of an electrical part, a movable member being disposed so as to elastically deform the contact pins, and an operation member being disposed to be vertically movable to thereby move the movable member, wherein each of the contact pins is provided with a pair of elastic pieces contacting a respective terminal of the electrical part, at least one of the elastic pieces being elastically deformed by the movement of the movable member to thereby move along a displacement direction so as to be contacted to or separated from the terminal of the electrical part, and when a respective elastic piece is elastically deformed and separated from a respective terminal of the electrical part and thereby opened maximally, said respective elastic piece and another elastic piece of an adjacent contact pin appear overlapped in a horizontal sectional view which is orthogonal to the displacement direction, and said respective elastic piece and said another elastic piece are substantially adjacent to each other along a perpendicular to the displacement direction.

2. The socket for an electrical part according to claim 1, wherein said movable member is vertically moved in accordance with the vertical motion of the operation member so as to elastically deform both of the paired elastic pieces of a respective contact pin.

3. The socket for an electrical part according to claim 1, wherein said movable member is horizontally slid in accordance with the vertical motion of the operation member so as to elastically deform both of the paired elastic pieces of a respective contact pin.

4. The socket for an electrical part according to claim 1, wherein a respective terminal of the electrical part is a solder ball having substantially spherical shape disposed to a surface of the IC package, and the paired elastic pieces of a respective contact pin are provided with contact portions, respectively, which are disposed on both side portions of the solder ball so as to interpose, therebetween, a center line of the solder ball along the displacement direction of the elastic pieces.

5. The socket for an electrical part according to claim 1, wherein a separation member is disposed to the socket body at a portion between one elastic piece of a contact pin and another elastic piece of the adjacent contact pin, when the first mentioned elastic piece is elastically deformed and separated from the terminal of the electrical part, while passing each other.

6. A socket for an electrical part comprising:

a socket body;

a number of contact pins which contact terminals of an electrical part for electrical connection;

a movable member disposed to the socket body for elastically deforming the contact pins;

an operation member disposed to the socket body to be vertically movable thereto for moving the movable member, each of said contact pins comprising a pair of elastic pieces and contact portions formed to end portions of the elastic pieces, respectively, respective elastic piece being elastically deformed by the movement of the movable member to thereby move along a displacement direction so as to be contacted to or separated from a respective terminal of the electrical part, and when said respective elastic piece is elastically deformed and separated from the respective terminal of the electrical part and opened maximally, said respective elastic piece and an elastic piece of an adjacent contact pin overlapped in a horizontal sectional view which is orthogonal to the displacement direction, and said respective elastic piece and said elastic piece of the adjacent contact pin are substantially adjacent to each other along a perpendicular to the displacement direction.

7. An apparatus comprising:

a plurality of contact pins respectively corresponding to a plurality of terminals of an electrical part, each contact pin comprising a pair of elastic pieces having a closed position in which the pair of elastic pieces electrically contact the corresponding terminal, and an opened position in which the pair of elastic pieces do not electrically contact the terminal, a respective elastic piece of the pair being elastically deformed to thereby move in a displacement direction to thereby change between the opened and closed positions, wherein when in the opened position, a respective elastic piece of the pair and an elastic piece of an adjacent contact pin appear overlapped in a horizontal sectional view which is orthogonal to the displacement direction, and are substantially adjacent to each other along a perpendicular to the displacement direction.

8. An apparatus as in claim 7, wherein the plurality of terminals are a plurality of solder balls, respectively.

9. An apparatus as in claim 7, further comprising a movable member which is movable to cause said elastic deformation and thereby change the position of a respective pair of elastic pieces from the opened to the closed position, and from the closed to the opened position.

10. An apparatus as in claim 7, wherein the apparatus is a socket for an electrical part.

11. A socket for an electrical part, comprising:

a socket body;

a plurality of contact pins on the socket body and respectively corresponding to a plurality of terminals of an electrical part, each contact pin comprising a pair of elastic pieces having a closed position in which the pair of elastic pieces electrically contact the corresponding terminal, and an opened position in which the pair of elastic pieces do not electrically contact the terminal, a respective elastic piece of the pair being elastically deformed to thereby move in a displacement direction to thereby change between the opened and closed positions, wherein, when in the opened position, a respective elastic piece of the pair and an elastic piece of an adjacent contact pin appear overlapped in a horizontal sectional view which is orthogonal to the displacement direction, and are substantially adjacent to each other along a perpendicular to the displacement direction.

12. An apparatus comprising:

a plurality of contact pins respectively corresponding to a plurality of terminals of an electrical part, each contact pin comprising a pair of elastic pieces having a closed position in which the pair of elastic pieces electrically contact the corresponding terminal, and an opened position in which the pair of elastic pieces do not electrically contact the terminal, a respective elastic piece of the pair being elastically deformed to thereby move in a displacement direction to thereby change between the opened and closed positions; and means for arranging the plurality of contact pins with respect to each other so that, when a respective pair of elastic pieces is in the opened position, a respective elastic piece of the pair and an elastic piece of an adjacent contact pin appear overlapped in a horizontal sectional view which is orthogonal to the displacement direction, and are substantially adjacent to each other along a perpendicular to the displacement direction.

13. An apparatus comprising:

a plurality of adjacent contact pins respectively corresponding to a plurality of terminals of an electrical part, each contact pin comprising a pair of elastic pieces having a dosed position in which the pair of elastic pieces electrically contact the corresponding terminal, and an opened position in which the pair of elastic pieces do not electrically contact the terminal, a respective elastic piece of the pair being elastically deformed to thereby move in a displacement direction to thereby change between the opened and closed positions, wherein when in the opened position, a respective elastic piece of the pair and an elastic piece of an opened pair of an adjacent contact pin appear overlapped in a horizontal sectional view which is orthogonal to the displacement direction, and are substantially adjacent to each other along a perpendicular to the displacement direction.

\* \* \* \* \*

UNITED STATES PATENT AND TRADEMARK OFFICE
CERTIFICATE OF CORRECTION

PATENT NO. : 6,743,034 B2
DATED : June 1, 2004
INVENTOR(S) : Hideo Shimada et al.

It is certified that error appears in the above-identified patent and that said Letters Patent is hereby corrected as shown below:

Column 10,
Line 55, insert -- appear -- before "overlapped."

Column 12,
Line 25, change "dosed" to -- closed --.

Signed and Sealed this

Fifteenth Day of February, 2005

JON W. DUDAS
*Director of the United States Patent and Trademark Office*